(12) United States Patent
Jacob

(10) Patent No.: US 9,634,123 B2
(45) Date of Patent: Apr. 25, 2017

(54) FINFET DEVICE INCLUDING A DIELECTRICALLY ISOLATED SILICON ALLOY FIN

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/676,909

(22) Filed: Apr. 2, 2015

(65) Prior Publication Data

US 2016/0163831 A1   Jun. 9, 2016

Related U.S. Application Data

(60) Provisional application No. 62/088,261, filed on Dec. 5, 2014.

(51) Int. Cl.
*H01L 29/66* (2006.01)
*H01L 21/762* (2006.01)
*H01L 29/78* (2006.01)

(52) U.S. Cl.
CPC .. *H01L 29/66795* (2013.01); *H01L 21/76224* (2013.01); *H01L 29/7854* (2013.01)

(58) Field of Classification Search
CPC .................................................. H01L 21/76224
See application file for complete search history.

(56) References Cited

U.S. PATENT DOCUMENTS

| | | | | |
|---|---|---|---|---|
| 9,362,179 | B1 * | 6/2016 | Cheng | H01L 29/1054 |
| 9,406,803 | B2 * | 8/2016 | Jacob | H01L 29/7851 |
| 9,478,663 | B2 * | 10/2016 | Jacob | H01L 29/7851 |
| 2015/0069465 | A1 * | 3/2015 | Cheng | H01L 29/36 257/190 |

* cited by examiner

*Primary Examiner* — Seahvosh Nikmanesh
(74) *Attorney, Agent, or Firm* — Amerson Law Firm, PLLC

(57) ABSTRACT

A method includes forming a fin on a semiconductor substrate. An isolation structure is formed adjacent the fin. A silicon alloy material is formed on a portion of the fin extending above the isolation structure. A thermal process is performed to define a silicon alloy fin portion from the silicon alloy material and the fin and to define a first insulating layer separating the fin from the substrate.

20 Claims, 8 Drawing Sheets

FINFET DEVICE INCLUDING A DIELECTRICALLY ISOLATED SILICON ALLOY FIN

BACKGROUND OF THE INVENTION

1. Field of the Invention

The present disclosure generally relates to the fabrication of semiconductor devices, and, more particularly, to a finFET device including a dielectrically isolated silicon alloy fin.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered, and irrespective of whether it is a planar or 3D finFET device, typically includes doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called finFET device has a three-dimensional (3D) structure. FIG. 1 is a perspective view of an illustrative prior art finFET semiconductor device 100 that is formed above a semiconductor substrate 105. In this example, the finFET device 100 includes three illustrative fins 110, a gate structure 115, sidewall spacers 120 and a gate cap 125. The gate structure 115 typically includes a layer of insulating material (not separately shown), e.g., a layer of high-k insulating material or silicon dioxide, and one or more conductive material layers (e.g., metal and/or polysilicon) that serve as the gate electrode for the device 100. The fins 110 have a three-dimensional configuration. The portions of the fins 110 covered by the gate structure 115 is the channel region of the finFET device 100. An isolation structure 130 is formed between the fins 110.

To improve carrier mobility, it is sometimes useful to use materials in the fin that are different from the base silicon (Si) of the substrate 105. For example, silicon germanium (SiGe) is a useful fin material. However, fabricating SiGe fin portions introduces difficulties associated with a difference in the thermal gradients of Si and SiGe. Also, annealing processes for isolation structures on the device exposes SiGe to an oxygen atmosphere that consumes some of the silicon germanium. A performance-limiting characteristic of alternative channel material finFET devices is off-state leakage current. Ideally, off-state leakage current is minimized to increase device performance.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes forming a fin on a semiconductor substrate. An isolation structure is formed adjacent the fin. A silicon alloy material is formed on a portion of the fin extending above the isolation structure. A thermal process is performed to define a silicon alloy fin portion from the silicon alloy material and the fin and to define a first insulating layer separating the fin from the substrate.

Another method includes forming a fin on a semiconductor substrate. An isolation structure is formed adjacent the fin. A silicon germanium material is formed on a portion of the fin extending above the isolation structure. A first insulating layer is formed above the fin and the silicon germanium material. A thermal condensation process is performed to define a silicon germanium fin portion from the silicon germanium material and the fin and to define a second insulating layer separating the fin from the substrate

BRIEF DESCRIPTION OF THE DRAWINGS

The disclosure may be understood by reference to the following description taken in conjunction with the accompanying drawings, in which like reference numerals identify like elements, and in which.

Figure 1:
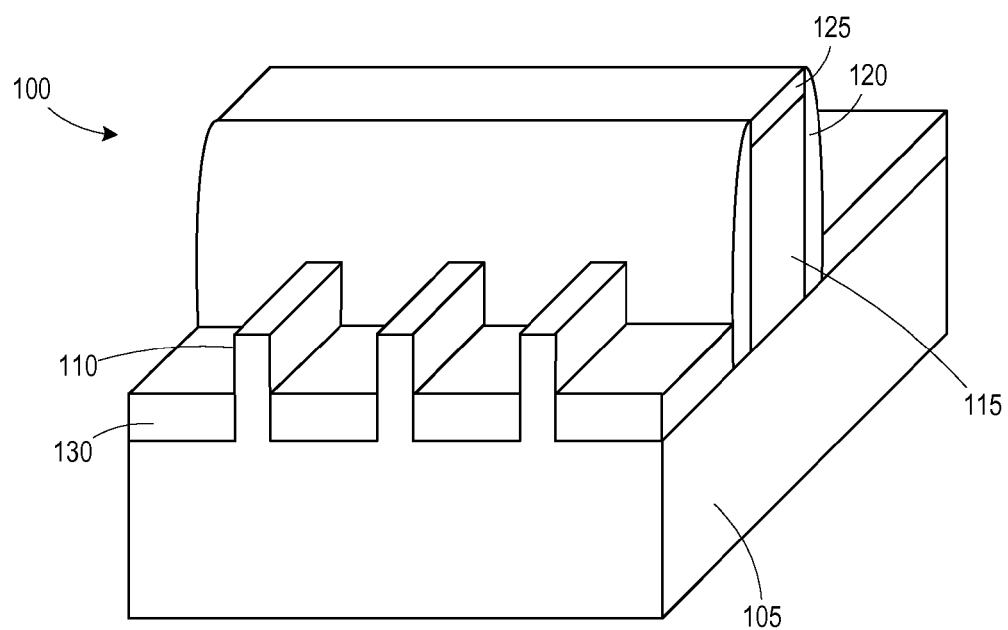
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a finFET device with a dielectrically isolated silicon alloy fin. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2E illustrate various methods for forming a finFET device 200. FIGS. 2A-2E show a cross-sectional view (in the gate width direction of the device 200) of a substrate 205 with a fin 210 defined thereon. An isolation structure 215 (e.g., silicon dioxide) is defined adjacent the fin 210 to separate the fin 210 from adjacent fins (not shown). The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers. For example, the fin 210 may be formed in a process layer formed above a base layer of the substrate 205.

Figure 2A:
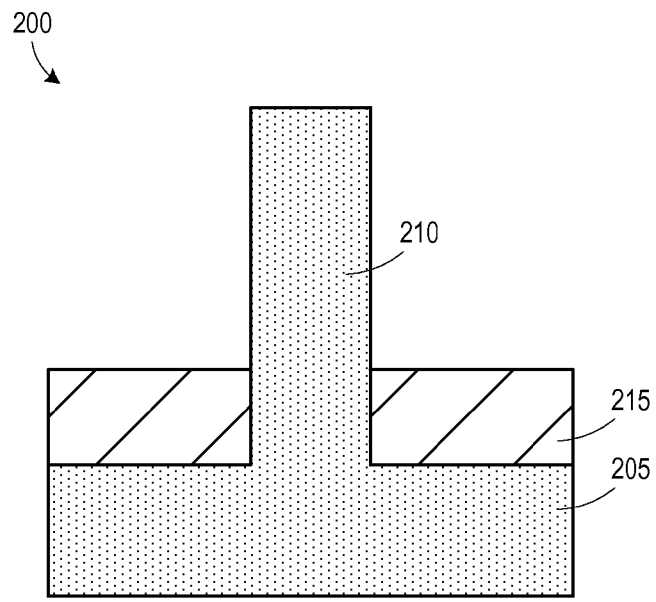
FIGS. 2A-2E depict various methods disclosed herein of forming a finFET device.
Figure 2B:
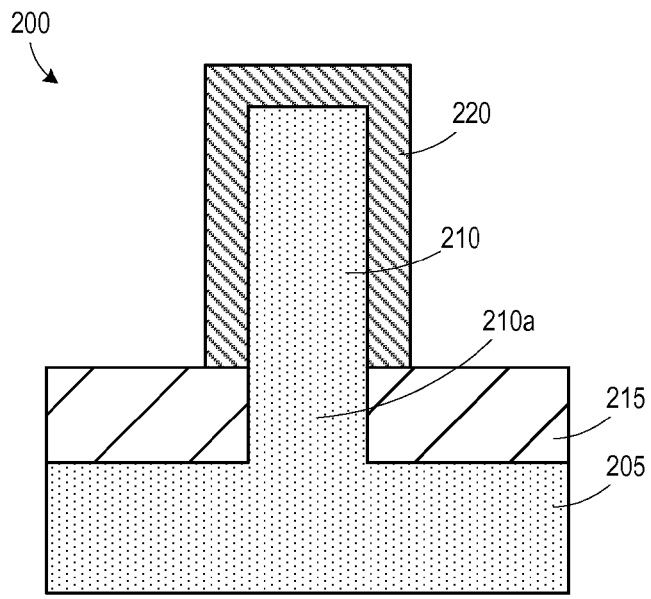

FIG. 2B illustrates the device 200 after an epitaxial growth process is performed to clad the fin 210 with a silicon alloy material 220, such as silicon germanium. In some embodiments, the silicon alloy material 220 may be formed in a strained state. In FIG. 2B, it is assumed that the substrate 205 is oriented such that the fin 210 has a crystallographic orientation corresponding to a (100) plane along its sidewall and top surface. Accordingly, the epitaxial growth exhibits substantially uniform characteristics. Additionally, a portion 210a of the fin 210 is disposed below the silicon alloy material 220 and laterally surrounded by the isolation structure 215, as shown in FIG. 2B.

Figure 2C:
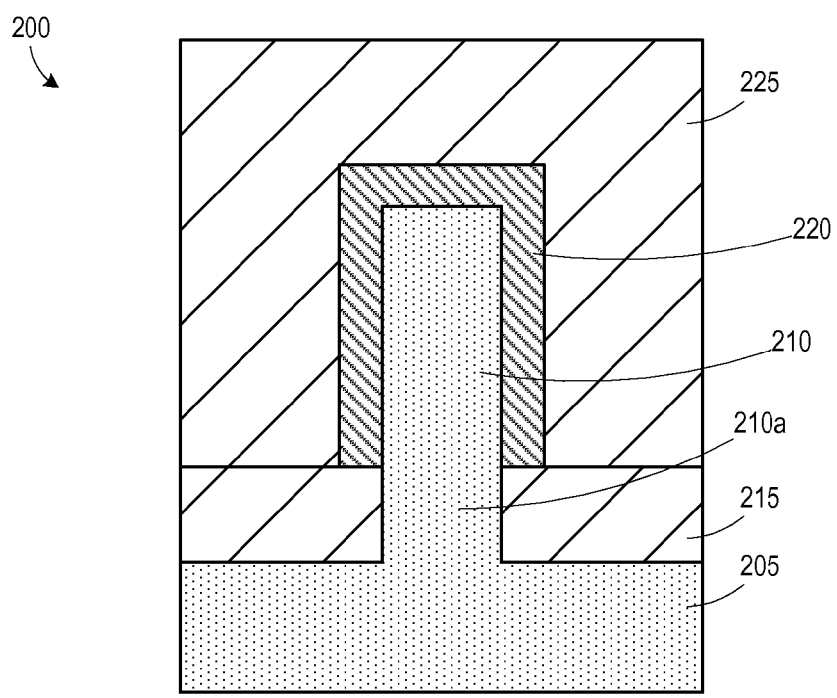

FIG. 2C illustrates the device 200 after a deposition process is performed to form an insulating layer 225 above the fin 210 and silicon alloy material 220. The insulating layer 225 may be formed of the same material as the isolation structure 215 (e.g., silicon dioxide).

Figure 2D:
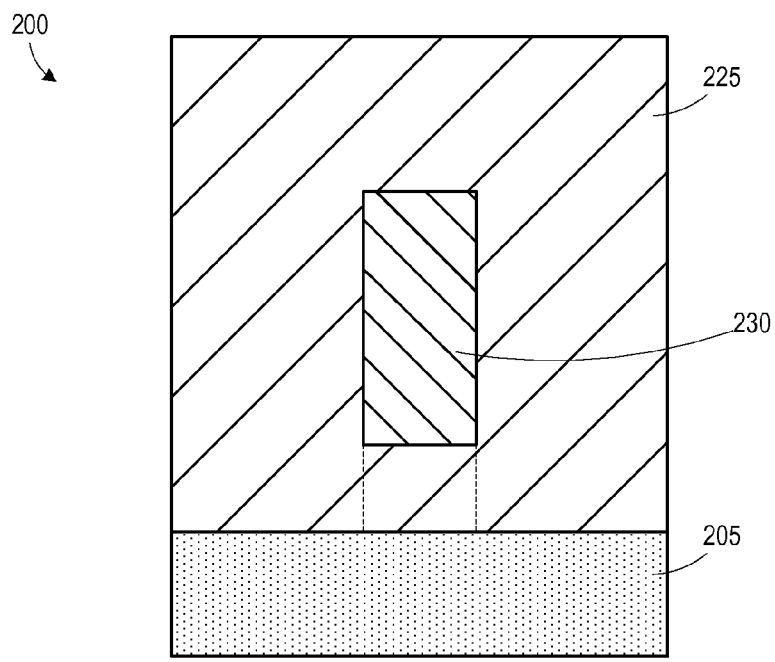

FIG. 2D illustrates the device 200 after a thermal process, such as a condensation process and the like, is performed. During the thermal, e.g., condensation, process, an oxygen-containing ambient is provided and the substrate is heated to a temperature of approximately 400-1000° C., where the processing time increases with decreasing temperature. The oxygen in the ambient reacts with silicon in the fin 210 and the silicon alloy material 220, causing silicon dioxide to form and precipitate out of the fin region. The germanium in the silicon alloy material 220 thermally mixes with the silicon in the fin 210 to define a silicon alloy fin 230. The concentration of the germanium in the silicon alloy fin 230 depends on the initial germanium concentration in the silicon alloy material 220 and the length of the condensation process. For example, the silicon alloy fin 230 may have substantially equal concentrations of silicon and germanium or the silicon alloy fin 230 may be germanium rich (i.e., the germanium concentration is higher than the silicon concentration). Additionally, the portion 210a of the fin 210 disposed below the silicon alloy material 220 and laterally surrounded by the isolation structure 215 is converted to insulating material (e.g., silicon dioxide) during the condensation process. After completion of the condensation process, the silicon alloy fin 230 may have a substantially vertical sidewall profile, as shown in FIG. 2D. The strained state of the silicon alloy material in the fin 230 may be retained.

Figure 2E:
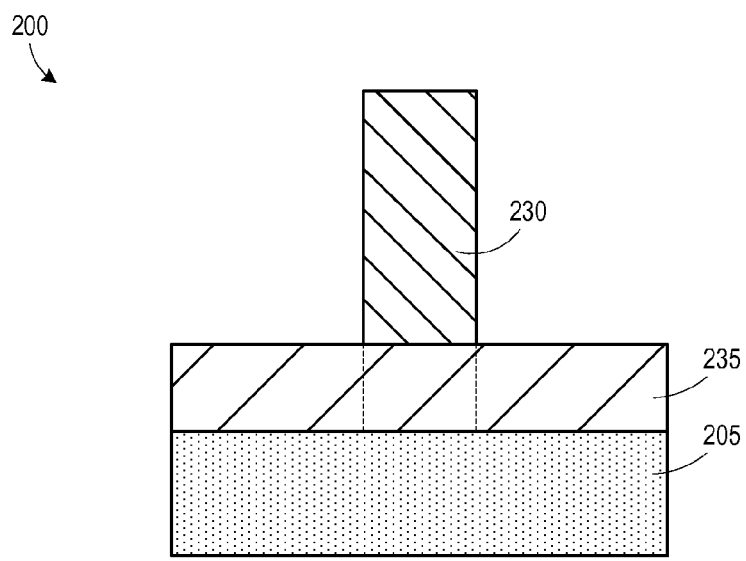

FIG. 2E illustrates the device 200 after a planarization process is performed on the insulating layer 225 (e.g., chemical mechanical planarization) to remove a first portion extending above the silicon alloy fin 230, and an etch process is performed to recess the remaining portion of the insulating layer 225 so that an insulating layer 235 remains between the silicon alloy fin 230 and the substrate 205.

Additional processing steps (not shown) may be performed to complete fabrication of the finFET device 200, such as the forming of a gate electrode structure and implantation steps to dope source/drain regions of the finFET device 200. Silicidation processes may be performed to form contact areas on the finFET device 200, and subsequent metallization layers and interconnect lines and vias may be formed. Other layers of material, such as a stress-inducing contact etch stop layer and the like, may be present but are not depicted in the attached drawings.

Figure 3A:
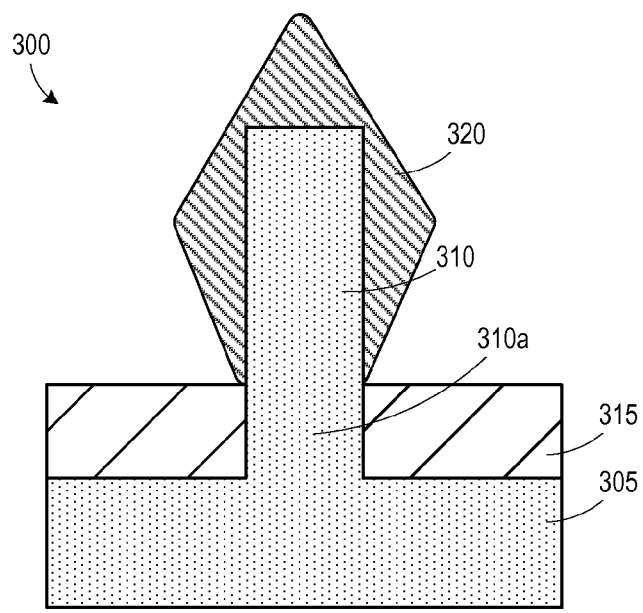
FIGS. 3A-3D depict an alternative method for forming a finFET device using an alternative crystal orientation.

FIGS. 3A-3D illustrate an alternative process flow for forming a finFET device 300, where the substrate 305 is oriented such that the fin 310 has a crystallographic orientation corresponding to a (110) plane along its sidewall and top surface. Accordingly, the epitaxial growth process results in a substantially faceted or diamond-shaped silicon alloy material 320 above the isolation structure 315, as shown in FIG. 3A. Additionally, a portion 310a of the fin 310 is disposed below the silicon alloy material 320 and laterally surrounded by the isolation structure 315, as shown in FIG. 3A. In some embodiments, the silicon alloy material 320 may be formed in a strained state.

Figure 3B:
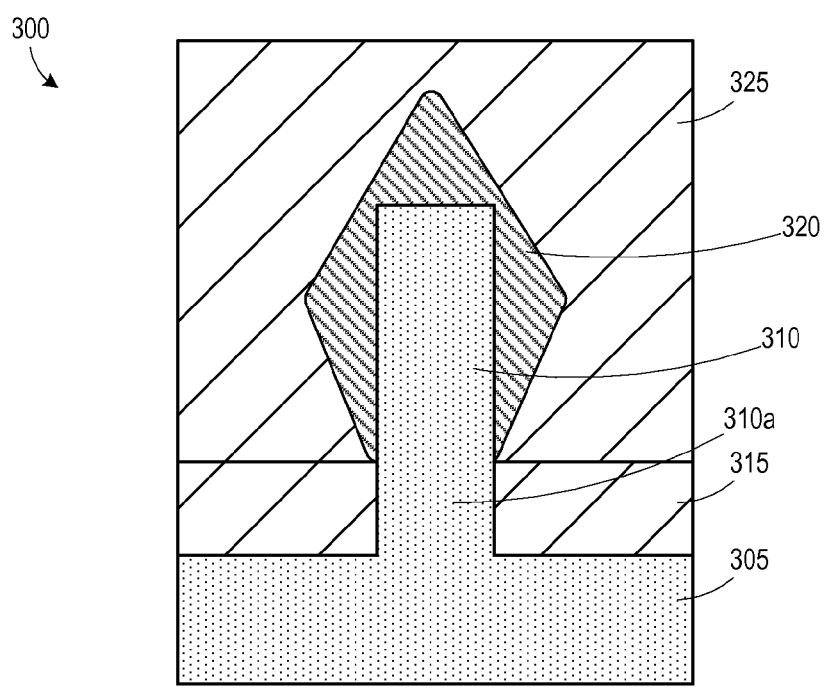

FIG. 3B illustrates the device 300 after a deposition process is performed to form an insulating layer 325 above the fin 310 and silicon alloy material 320. The insulating layer 325 may be formed of the same material as the isolation structure 315 (e.g., silicon dioxide).

Figure 3C:
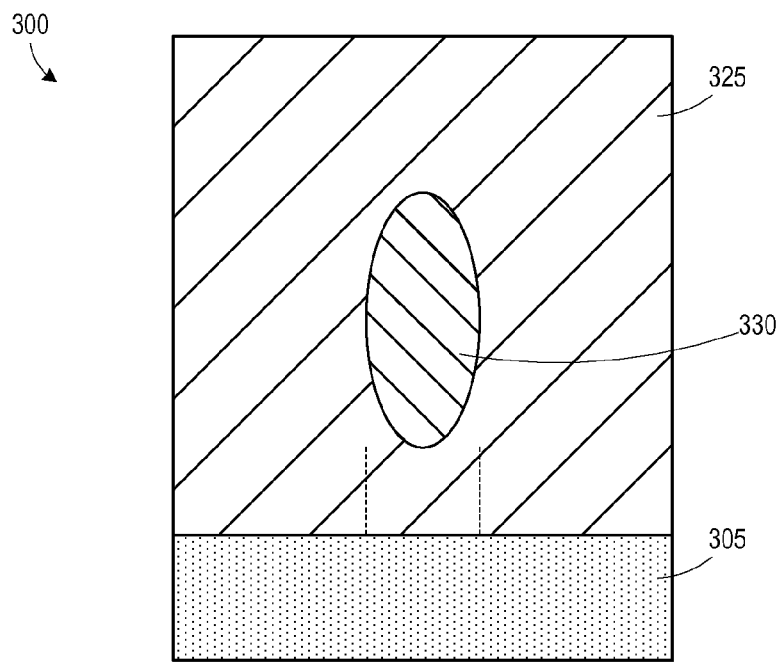

FIG. 3C illustrates the device 300 after a thermal process, e.g., a condensation process, is performed. Due to the diamond shape of the silicon alloy material 320, a silicon alloy fin 330 has an oval shape after the condensation process. Again, the concentration of the germanium in the silicon alloy fin 330 depends on the initial germanium concentration in the silicon alloy material 320 and the length of the condensation process. For example, the silicon alloy fin 330 may have substantially equal concentrations of silicon and germanium or the silicon alloy fin 330 may be germanium rich (i.e., the germanium concentration is higher than the silicon concentration). Additionally, the portion 310a of the fin 310 disposed below the silicon alloy material 320 and laterally surrounded by the isolation structure 315 is converted to insulating material (e.g., silicon dioxide) during the condensation process. The strained state of the silicon alloy material in the fin 330 may be retained. One advantage of the oval structure of the silicon alloy fin 330 is that both electron and hole mobility in the oval structure are equally high whether grown on preferential <110> or <100> planes. In comparison, the silicon alloy fin 230 illustrated in FIG. 2E has an advantage of an increased uniformity film, but a reduced hole mobility. For the oval fin structure silicon alloy fin 330, the defects would likely be decreased, uniformity would likely be increased, and since there is no preferential plane, the total transport (NMOS+PMOS) would be higher compared to the silicon alloy fin 230.

Figure 3D:
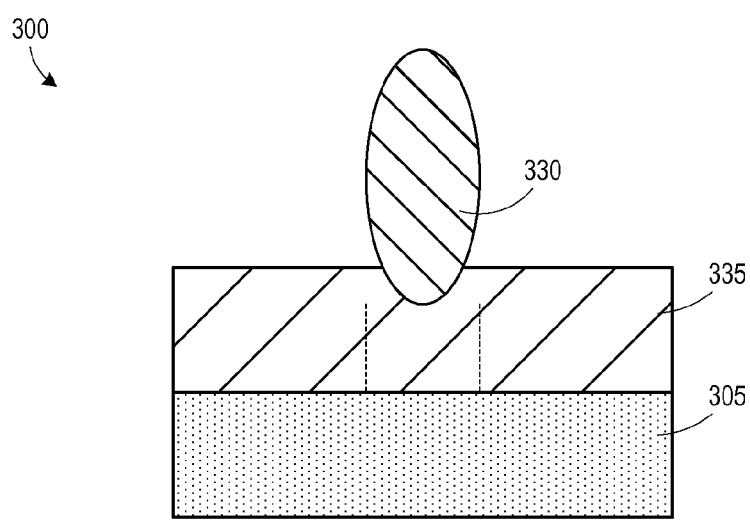

FIG. 3D illustrates the device 300 after a planarization process is performed on the insulating layer 325 (e.g., chemical mechanical planarization) to remove a first portion extending above the silicon alloy fin 330, and an etch process is performed to recess the remaining portion of the insulating layer 325 so that an insulating layer 335 remains between the silicon alloy fin 330 and the substrate 305.

Again, additional processing steps (not shown) may be performed to complete fabrication of the finFET device 300, as described above.

Figure 4A:
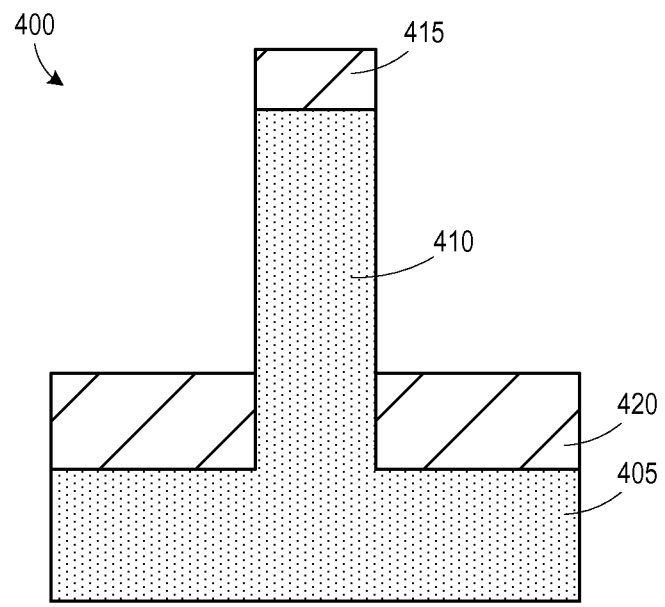
FIGS. 4A-4E illustrate various alternative methods disclosed herein for forming a finFET device in the presence of a hard mask layer.

FIGS. 4A-4E illustrate an alternative process flow for forming a finFET device 400. The substrate 405 is patterned to define a fin 410 using a patterned hard mask layer 415 (e.g., silicon nitride). The isolation structure 420 is etched selective to the hard mask layer 415, so that it can be formed while still preserving the hard mask layer 415, as illustrated in FIG. 4A.

Figure 4B:
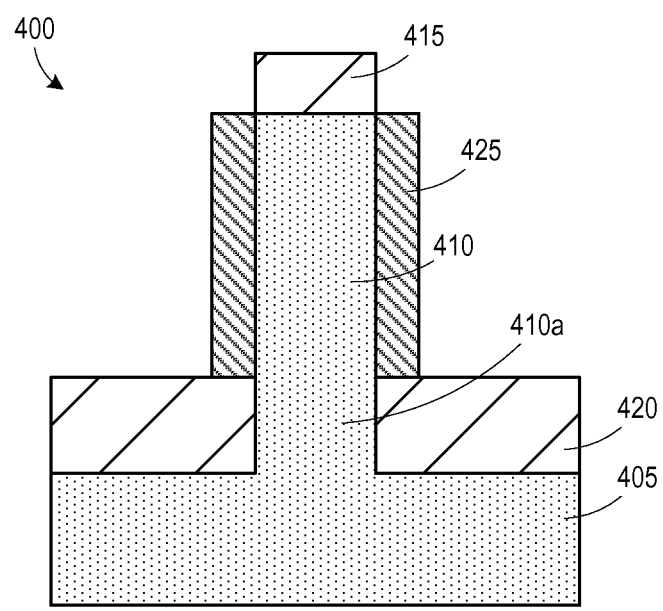

FIG. 4B illustrates the device 400 after an epitaxial growth process is performed to clad the fin 410 with a silicon alloy material 425, such as silicon germanium. Due to the presence of the hard mask layer 415, the silicon alloy material 425 is formed having a substantially uniform profile regardless of the crystal orientation of the fin 410. Additionally, a portion 410a of the fin 410 is disposed below the silicon alloy material 425 and laterally surrounded by the isolation structure 420, as shown in FIG. 4B. In some embodiments, the silicon alloy material 425 may be formed in a strained state.

Figure 4C:
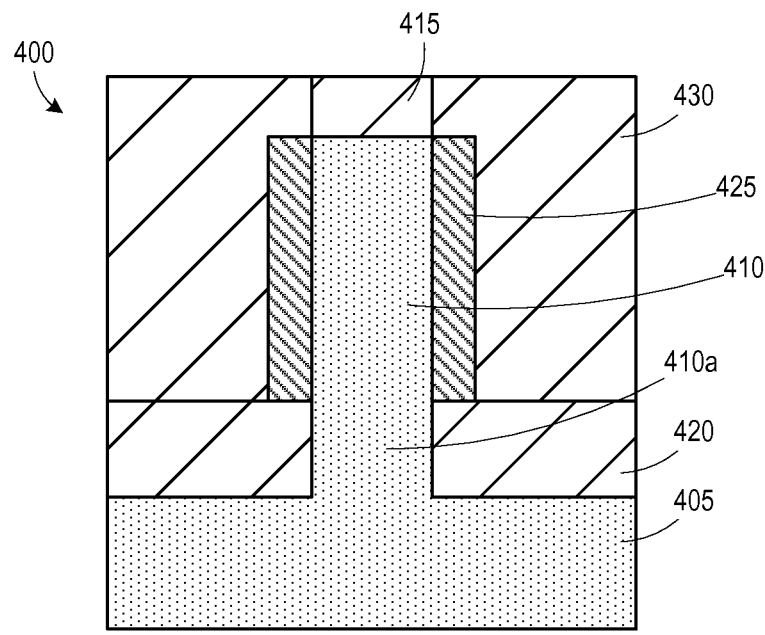

FIG. 4C illustrates the device 400 after a deposition process is performed to form an insulating layer 430 above the fin 410 and silicon alloy material 425. The insulating layer 430 may be formed of the same material as the isolation structure 420 (e.g., silicon dioxide).

Figure 4D:
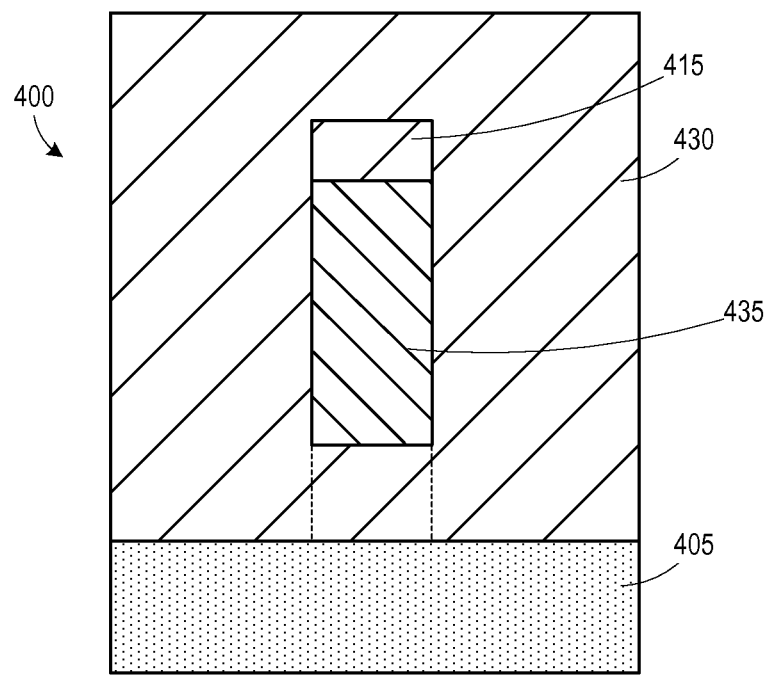

FIG. 4D illustrates the device 400 after a thermal process, e.g., a condensation process and the like, is performed to define a silicon alloy fin 435. The concentration of the germanium in the silicon alloy fin 435 depends on the initial germanium concentration in the silicon alloy material 425 and the length of the condensation process. For example, the silicon alloy fin 435 may have substantially equal concentrations of silicon and germanium or the silicon alloy fin 435 may be germanium rich (i.e., the germanium concentration is higher than the silicon concentration). Additionally, the portion 410a of the fin 410 disposed below the silicon alloy material 425 and laterally surrounded by the isolation structure 420 is converted to insulating material (e.g., silicon dioxide) during the condensation process. After completion of the condensation process, the silicon alloy fin 435 may have a substantially vertical sidewall profile, as shown in FIG. 4D. The strained state of the silicon alloy material in the fin 435 may be retained.

Figure 4E:
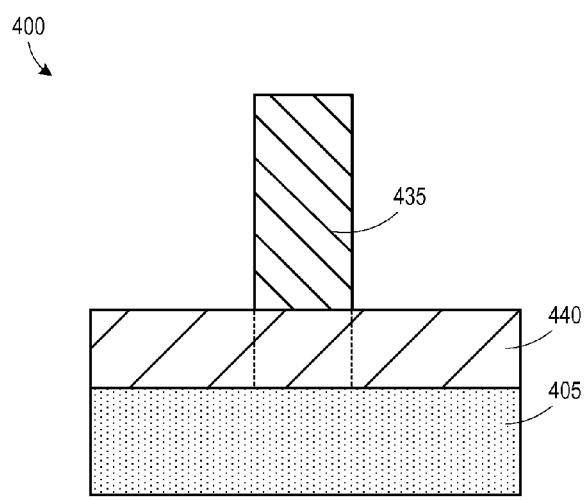

FIG. 4E illustrates the device 400 after a planarization process is performed (e.g., chemical mechanical planarization) to remove a first portion of the insulating layer 430 extending above the silicon alloy fin 435 and to remove the cap layer 415, and an etch process is performed to recess the remaining portion of the insulating layer 430 so that an insulating layer 440 remains between the silicon alloy fin 435 and the substrate 405.

Again, additional processing steps (not shown) may be performed to complete fabrication of the finFET device 400, as described above.

The processes for forming the silicon alloy fins 230, 330, 435 described herein result in low defect silicon alloy materials, which tend to increase device quality and performance. The dielectric material separating the silicon alloy fins 230, 330, 435 from the respective substrates 205, 305, 405 reduces off-state leakage current at aggressively scaled gate lengths. The methods discussed herein generate dielectric isolation for the semiconductor alloy fins and extremely low defectivity in the fins, resulting in improved device quality and performance. The provision of a strained state in the silicon alloy fins also improves performance. Control over the thickness and shape of the silicon alloy fins is provided based on the thermal processing conditions and time, without the need for a more complex process flow or additional mask layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a fin on a semiconductor substrate;
    forming an isolation structure adjacent said fin;
    depositing a first layer to form a silicon alloy material layer above and in direct contact with an outer sidewall surface of said fin extending above said isolation structure after forming said isolation structure; and
    performing a thermal process to define a silicon alloy fin portion from said silicon alloy material layer and said fin and to define a first insulating layer separating said fin from said substrate.

2. The method of claim 1, wherein said silicon alloy material layer comprises silicon germanium.

3. The method of claim 2, wherein a germanium concentration of said silicon germanium is higher than a silicon concentration of said silicon germanium.

4. The method of claim 1, wherein said thermal process comprises a condensation process.

5. The method of claim 1, wherein said silicon alloy fin portion comprises a strained material.

6. The method of claim 1, wherein said silicon alloy fin portion has a substantially vertical sidewall profile.

7. The method of claim 1, wherein said silicon alloy fin portion has an oval shape.

8. The method of claim 1, wherein a hard mask layer is disposed on a top surface of said fin, and said forming said silicon alloy material layer comprises forming said silicon alloy material layer in the presence of said hard mask layer.

9. The method of claim 8, further comprising removing said hard mask layer after performing said thermal process.

10. The method of claim 1, further comprising forming a second insulating layer above said fin and said silicon alloy material layer prior to performing said thermal process.

11. The method of claim 10, further comprising recessing said second insulating layer after said thermal process to expose said silicon alloy fin portion.

12. The method of claim 1, wherein said performing said thermal process comprises converting a second portion of said fin not extending above said isolation structure to a dielectric material to form said first insulating layer.

13. A method, comprising:
    forming a fin on a semiconductor substrate;
    forming an isolation structure adjacent said fin;
    depositing a first layer to form a silicon germanium material layer above and in direct contact with an outer sidewall surface of said fin extending above said isolation structure after forming said isolation structure;
    forming a first insulating layer above said fin and said silicon germanium material; and
    performing a thermal condensation process to define a silicon germanium fin portion from said silicon germanium material layer and said fin and to define a second insulating layer separating said fin from said substrate.

14. The method of claim 13, wherein a germanium concentration of said silicon germanium is higher than a silicon concentration of said silicon germanium in said silicon germanium fin portion.

15. The method of claim 13, wherein said silicon germanium fin portion comprises a strained material.

16. The method of claim 13, wherein said silicon germanium fin portion has a substantially vertical sidewall profile.

17. The method of claim 13, wherein said silicon germanium fin portion has an oval shape.

18. The method of claim 13, wherein a hard mask layer is disposed on a top surface of said fin, and said forming said silicon germanium material layer comprises forming said silicon germanium material layer in the presence of said hard mask layer.

19. The method of claim 13, further comprising recessing said first insulating layer after said thermal process to expose said silicon germanium fin portion.

20. The method of claim 13, wherein said performing said thermal process comprises converting a second portion of said fin not extending above said isolation structure to a dielectric material to form said first insulating layer.

* * * * *